US012727347B2

(12) United States Patent
Nakata

(10) Patent No.: US 12,727,347 B2
(45) Date of Patent: Sep. 1, 2026

(54) SEMICONDUCTOR DEVICE, DISPLAY DEVICE, IMAGING DEVICE, ELECTRONIC DEVICE AND IMAGE FORMING APPARATUS

(71) Applicant: CANON KABUSHIKI KAISHA, Tokyo (JP)

(72) Inventor: Norihiko Nakata, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 535 days.

(21) Appl. No.: 18/325,234

(22) Filed: May 30, 2023

(65) Prior Publication Data

US 2023/0397463 A1 Dec. 7, 2023

(30) Foreign Application Priority Data

Jun. 7, 2022 (JP) ................................ 2022-092122

(51) Int. Cl.

*H10K 59/131* (2023.01)
*H10K 59/65* (2023.01)
*H10K 59/80* (2023.01)
*H10K 102/00* (2023.01)

(52) U.S. Cl.

CPC ........... *H10K 59/131* (2023.02); *H10K 59/65* (2023.02); *H10K 59/879* (2023.02); *H10K 59/8792* (2023.02); *H10K 2102/351* (2023.02)

(58) Field of Classification Search

CPC .... H10K 59/131; H10K 59/65; H10K 59/879; H10K 59/8792; H10K 2102/351; H10K 59/82; H10K 59/873; H10K 59/12; H10K 59/1315; H10K 39/34; H10K 59/858; H10K 59/00; H10K 59/70; H10K 59/865; H10K 59/80–88; H10F 39/804–8063; H10F 39/12–813

See application file for complete search history.

(56) References Cited

U.S. PATENT DOCUMENTS 5,595,934 A 1/1997 Kim
6,768,565 B1 * 7/2004 Perregaux ........... H10F 39/8053 250/226
10,868,203 B1 12/2020 Lee
(Continued)

FOREIGN PATENT DOCUMENTS

JP 8-316267 A 11/1996
JP 2009-145789 A 7/2009
(Continued)

OTHER PUBLICATIONS

Notice of Reasons for Refusal in Japanese Application No. 2022-092122 (Apr. 2026).

*Primary Examiner* — Chad M Dicke
*Assistant Examiner* — Gary Abel
(74) *Attorney, Agent, or Firm* — Venable LLP

(57) ABSTRACT

A semiconductor device includes: a substrate having a pixel region in which a functional element is disposed, and a terminal region disposed at a position different from that of the pixel region; a connection terminal disposed in the terminal region; an anti-reflection film disposed closer to a light incidence side or light exit side than the functional element; and a protective film disposed, on a surface of the connection terminal, with a thickness of 20 nm or less; wherein a thickness of the protective film is different from a thickness of the anti-reflection film.

19 Claims, 9 Drawing Sheets

(56) References Cited

U.S. PATENT DOCUMENTS

| | | | | |
|---|---|---|---|---|
| 10,998,371 | B1 | 5/2021 | Hanelt et al. | |
| 11,239,400 | B1 | 2/2022 | Chio et al. | |
| 2005/0041296 | A1* | 2/2005 | Hsiao | H10F 77/413 257/E31.128 |
| 2006/0228826 | A1* | 10/2006 | Kim | H10F 39/024 438/75 |
| 2007/0120058 | A1* | 5/2007 | Blackwell | G01J 5/20 348/E5.09 |
| 2007/0152251 | A1* | 7/2007 | Park | H10F 39/024 257/294 |
| 2008/0293181 | A1* | 11/2008 | Ryu | H10F 39/024 257/E31.127 |
| 2013/0020935 | A1* | 1/2013 | Ohazama | H10K 59/179 313/504 |
| 2013/0147032 | A1* | 6/2013 | Jeng | H10P 74/277 257/737 |
| 2016/0190055 | A1* | 6/2016 | Jinbo | G06F 3/012 257/750 |
| 2016/0190331 | A1* | 6/2016 | Miyake | H10D 86/441 257/40 |
| 2017/0294463 | A1* | 10/2017 | Yamazaki | H10D 86/441 |
| 2020/0091209 | A1* | 3/2020 | Han | H10F 39/199 |
| 2021/0167133 | A1* | 6/2021 | Nakata | F21V 3/00 |

FOREIGN PATENT DOCUMENTS

| | | | |
|---|---|---|---|
| JP | 2009-272494 | A | 11/2009 |
| JP | 2011-018721 | A | 1/2011 |
| JP | 2014-082514 | A | 5/2014 |
| JP | 2019-54048 | A | 4/2019 |

* cited by examiner

FIG. 8A
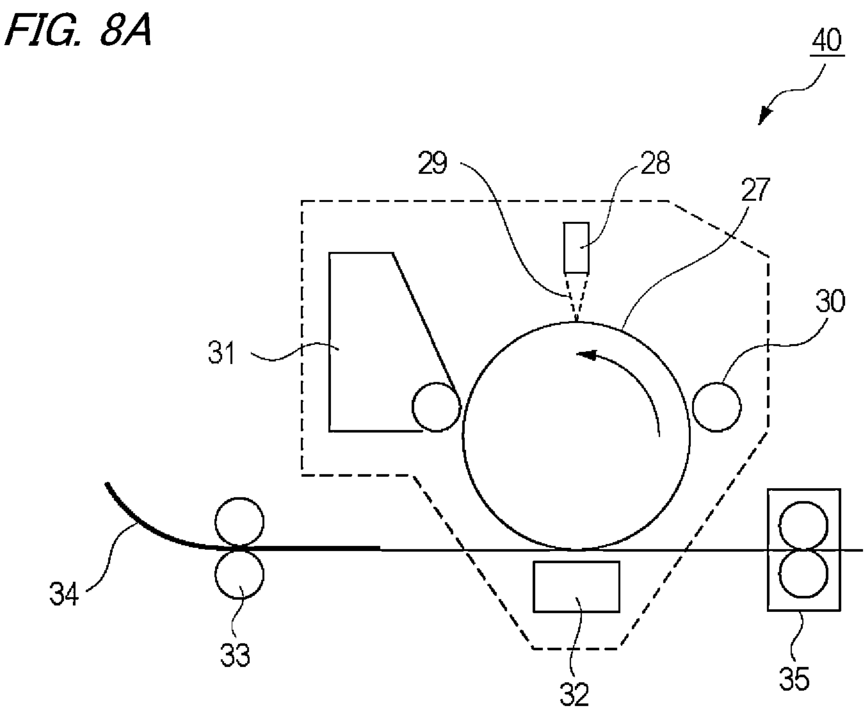
FIG. 8B
FIG. 8C
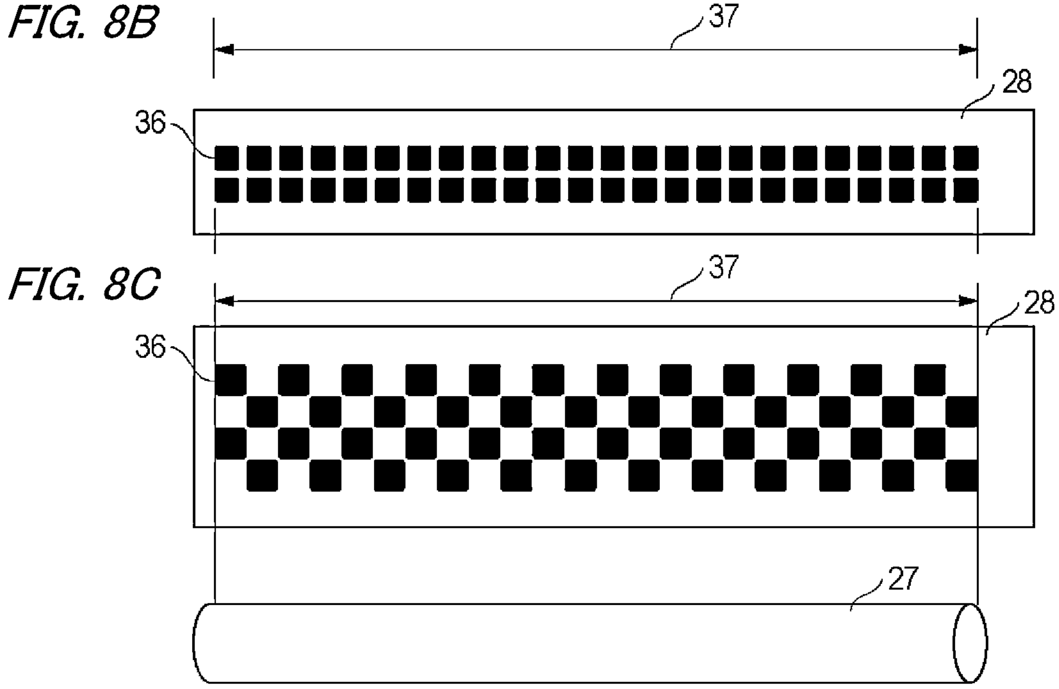

SEMICONDUCTOR DEVICE, DISPLAY DEVICE, IMAGING DEVICE, ELECTRONIC DEVICE AND IMAGE FORMING APPARATUS

BACKGROUND OF THE INVENTION

Field of the Invention

The present invention relates to a semiconductor device, a display device, an imaging device, an electronic device and an image forming apparatus.

Description of the Related Art

Bonding pads for electrical conduction formed of aluminum (Al) or of an Al alloy are exposed on the surface of semiconductor devices. Exposed bonding pads are susceptible to problems that include corrosion and galvanic corrosion caused by a fluorine component on the bonding pads.

Japanese Patent Application Publication No. 2009-272494 discloses a technique for forming a protective layer out of an inorganic insulating material, with a view to preventing corrosion of bonding pads.

Although a bonding pad protective layer is formed herein out of an inorganic insulating material, Japanese Patent Application Publication No. 2009-272494 does not disclose a semiconductor device having an optical function, nor does it address achieving both bonding pad protection and optical characteristics of an anti-reflection film on a microlens.

SUMMARY OF THE INVENTION

The present invention provides a semiconductor device having an optical function and in which bonding pads are protected, in consideration of the optical characteristics of an anti-reflection film on a microlens.

A semiconductor device according to the present invention includes: a substrate having a pixel region in which a functional element is disposed, and a terminal region disposed at a position different from that of the pixel region; a connection terminal disposed in the terminal region; an anti-reflection film disposed closer to a light incidence side or light exit side than the functional element; and a protective film disposed, on a surface of the connection terminal, with a thickness of 20 nm or less; wherein a thickness of the protective film is different from a thickness of the anti-reflection film.

Further features of the present invention will become apparent from the following description of exemplary embodiments with reference to the attached drawings.

BRIEF DESCRIPTION OF THE DRAWINGS

FIG. 8A to FIG. 8C are schematic diagrams illustrating an image forming apparatus according to Embodiment 2.

DESCRIPTION OF THE EMBODIMENTS

Embodiments for carrying out the present invention will be explained below with reference to accompanying drawings. In the explanation and drawings that follow, configurations shared across the drawings are denoted by shared reference symbols. Therefore, shared configurations will be explained while interchangeably referring to multiple drawings; also, explanations bearing on configurations denoted by shared reference symbols may be omitted as appropriate.

Embodiment 1

Figure 1A:
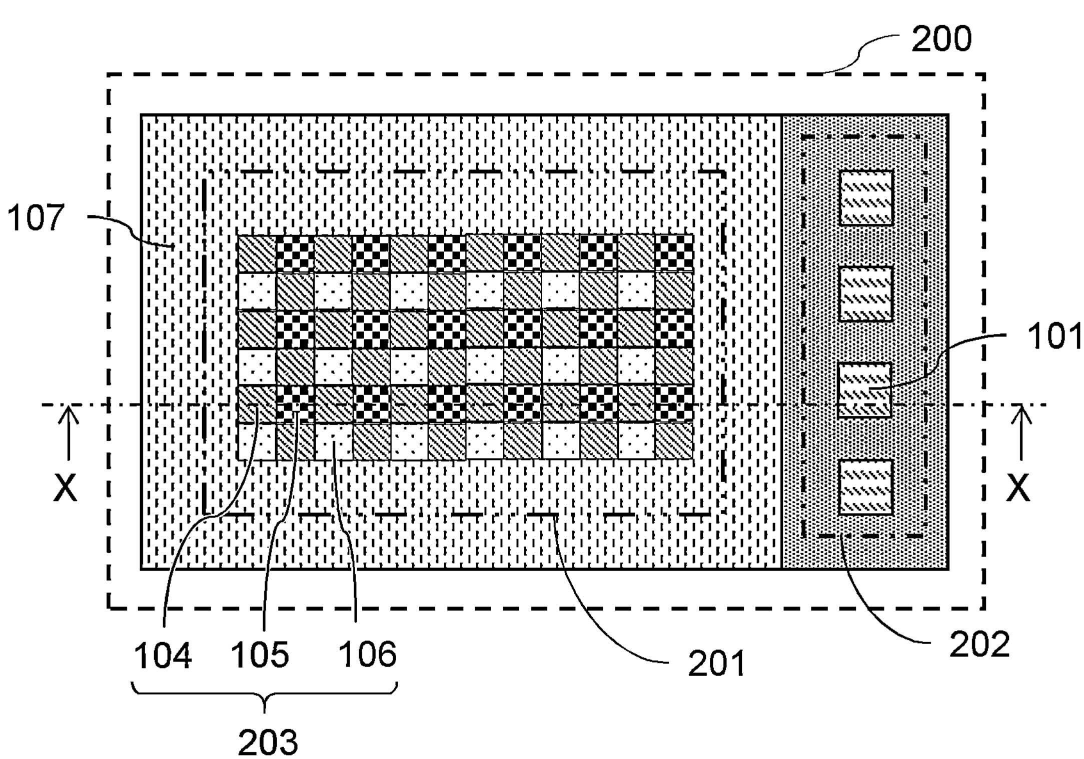
FIG. 1A and FIG. 1B are schematic diagrams illustrating an example of a semiconductor device.
Figure 1B:
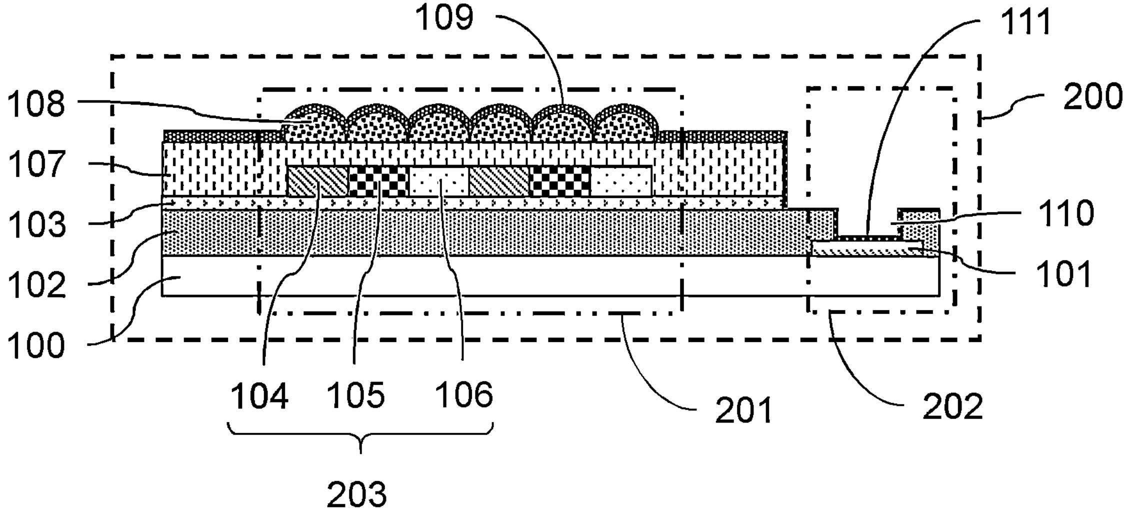

FIG. 1A and FIG. 1B are schematic diagrams illustrating an example of a semiconductor device 200. FIG. 1A is a plan-view diagram of the semiconductor device 200. FIG. 1B is an X-X cross-sectional diagram of the semiconductor device 200 illustrated in FIG. 1A.

The semiconductor device 200 has an element substrate 100, a passivation film 102, a lower planarization film 103, a color filter 203, an upper planarization film 107, microlenses 108 and an anti-reflection film 109. The semiconductor device 200 also has bonding pads 101 (connection terminals) and a protective film 111, with respective openings 110 formed over the bonding pads 101. In the explanation that follows the side on which the anti-reflection film 109 of the semiconductor device 200 is formed will be the upper side, the side on which the element substrate 100 is formed will be the lower side, and the surface of the respective members on the upper side will be notated as the upper surface and the surface on the lower side will be notated as the lower surface.

The semiconductor device 200 has a pixel region 201 in which multiple organic light-emitting elements (functional elements) are disposed, and an external connection terminal region 202 (terminal region) in which bonding pads 101 are formed. The semiconductor device 200 of the present embodiment can be used for instance in an imaging device or in a display device. In a case where the semiconductor device 200 is used in an imaging device, the element substrate 100 is an imaging element substrate, and imaging elements are disposed in the pixel region 201. In a case where the semiconductor device 200 is used in a display device, the element substrate 100 is a display element substrate, and light-emitting elements are disposed in the pixel region 201. The external connection terminal region 202 is disposed at a position different from that of the pixel region 201 on the element substrate 100.

The element substrate 100 includes for instance a semiconductor substrate, transistors, metal wiring and insulating members. For instance silicon can be used as the material of the semiconductor substrate. A glass substrate or a plastic substrate may be used instead of the semiconductor substrate. A metal such as Al or Cu can be used as a material for the metal wiring. A barrier metal such as Ti, Ta, TiN or TaN may be provided at the interface between an insulating member and a wiring structure, for the purpose of suppressing metal diffusion into an insulating layer. For instance Al or an Al alloy such as AlCu is used as the material of the bonding pads 101. The bonding pads 101 are formed on the element substrate 100.

An inorganic material such as silicon oxide or silicon nitride is used as the material of the passivation film 102. The passivation film 102, which is formed on the element substrate 100, may have a single-layer structure or a multilayer structure made up of a plurality of films having dissimilar compositions. The thickness of the passivation film 102 can be set for instance to range at least 10 nm and not more than 10 μm.

For instance an organic material is used as the material of the lower planarization film 103. The lower planarization film 103 is formed at least in the pixel region 201 on the upper surface of the passivation film 102, below the color filter 203. The thickness of the lower planarization film 103 can be set for instance to range from 1 nm to 100 μm. The lower planarization film 103 may be omitted if the surface of the passivation film 102 is flat and the adhesiveness of the color filter 203 and the passivation film 102 is good.

The color filter 203 is made up of three types of filter, for instance a green filter 104, a red filter 105 and a blue filter 106. An organic material such as a pigment-based material or a dye-based material is used as the material of the color filter 203. The color filter 203 is formed in at least the pixel region 201, on the upper surface of the lower planarization film 103. The green filter 104, the red filter 105 and the blue filter 106 are filters that transmit green, red and blue, respectively, to a higher degree than other colors. For instance, the green filter 104 transmits mainly green light.

The film thickness of the color filter 203 can be for instance set to range at least 100 nm and not more than 100 μm. The film thickness of each color filter (green filter 104, red filter 105 and blue filter 106) may be identical or dissimilar. The planar shape (shape when viewed from the vertical direction) of a light-emitting unit (organic light-emitting element) including the filter of one color and the corresponding microlenses 108 may be a square or hexagonal shape, or some other shape. In a case where the shape of the light-emitting unit is polygonal, the distance between opposite sides can be for instance set to range at least 100 nm and not more than 100 μm.

FIG. 1A illustrates an example where in the pixel region 201 there are alternately arrayed, in the row direction, columns in which the green filter 104 and red filter 105 are alternately disposed and columns in which the green filter 104 and blue filter 106 are alternately disposed. The arrangement of the color filter 203 in the pixel region 201 is not limited thereto, and as illustrated in FIG. 1B, the green filter 104, the red filter 105, and the blue filter 106 may be repeatedly disposed sequentially in each row. The color filter 203 can thus be arbitrarily disposed, in the pixel region 201, depending on the use of the semiconductor device 200.

For instance, an organic material is used as the material of the upper planarization film 107. The upper planarization film 107 is formed in at least the pixel region 201 on the upper surface of the layer of the color filter 203. The thickness of the upper planarization film 107 can be set to range for instance at least 1 nm and not more than 100 The upper planarization film 107 formed under the microlenses 108 may be omitted if the upper surface of the color filter 203 is flat.

For instance an organic material is used as the material of the microlenses 108. The microlenses 108 are formed in at least the pixel region 201 on the upper surface of the upper planarization film 107. The height of the microlenses 108 varies depending on the structure of the semiconductor device 200, and can be set to range for instance at least 100 nm and not more than 100 μm.

An inorganic material such as silicon oxide or silicon nitride is used as the material of the anti-reflection film 109. The anti-reflection film 109 is disposed on the light incidence side or the light exit side of the organic light-emitting elements (functional elements), and is formed so as to cover the microlenses 108 at least in the pixel region 201 on the upper surface of the microlenses 108. The thickness of the anti-reflection film 109 is determined depending on the use and structure of the semiconductor device 200. The thickness of the anti-reflection film 109 can be determined in accordance with the wavelength of the light the reflection of which is to be prevented and in accordance with the refractive index of the anti-reflection film 109, and can be set to range for instance at least 30 nm and not more than 500 nm.

The openings 110 over the bonding pads 101 are formed through etching of the anti-reflection film 109, the upper planarization film 107, the lower planarization film 103 and the passivation film 102 that are formed on the bonding pads 101. The openings 110 may be formed by etching the various layers, including another wiring interlayer film formed on the bonding pads 101. The opening width of the openings 110 can be set to range for instance at least 5 μm and not more than 1 mm.

The protective film 111 is formed on the surface (upper surface) of the bonding pads 101. An inorganic material such as silicon oxide or silicon nitride is used as the material of the protective film 111. The protective film 111 is formed to a thickness that allows for break-through thereof at the time of wire bonding. The bonding pads 101 need not be exposed prior to wire bonding, since the protective film 111 is broken through by wire bonding. An effect of reducing corrosion can be achieved by covering thus the bonding pads 101 with the protective film 111 so that the bonding pads 101 are not exposed.

The protective film 111 is formed to a thickness larger than 0 nm, up to 20 nm, so as to have a thickness that allows the protective film 111 to be broken through by wire bonding. With a view to being capable of functioning as a protective film, the thickness of the protective film 111 is preferably 8 nm or larger.

The openings 110 are formed for instance by photolithography and dry etching. The gas used for dry etching contains a fluorine component; this fluorine component remains in the openings 110.

A semiconductor device 200 having an optical function has an optical structure that utilizes an organic material such as the color filter 203 and the microlenses 108. Organic materials exhibit lower heat resistance and chemical resistance than inorganic materials, and accordingly it is difficult to remove the fluorine component remaining in the bonding pads 101 by high-temperature ashing or as a result of a chemical treatment. In the semiconductor device 200 having an optical function, therefore, corrosion occurs in the bonding pads 101 on account of the residual fluorine component; this give rise to joining problems in wire bonding and to poorer reliability of the bonding pads.

In the present embodiment the protective film 111 is formed on the bonding pads 101, and the upper surface of the bonding pads 101 is covered with the protective film 111; as a result, it becomes possible to reduce the occurrence of corrosion derived from absorption of moisture by the fluorine component on the bonding pads 101.

In optical terms, the thickness of the anti-reflection film 109 is determined so as not to detract from the anti-reflection function, whereas the thickness of the protective film 111 is determined from the viewpoint of being amenable to breakthrough at the time of wire bonding. The anti-reflection film 109 can fulfill an anti-reflection function, and the protective film 111 can protect the bonding pads 101, by setting thus the anti-reflection film 109 and the protective film 111 to have dissimilar thicknesses. The thickness of the protective film 111 is preferably smaller than the thickness of the anti-reflection film 109.

Figure 2A:
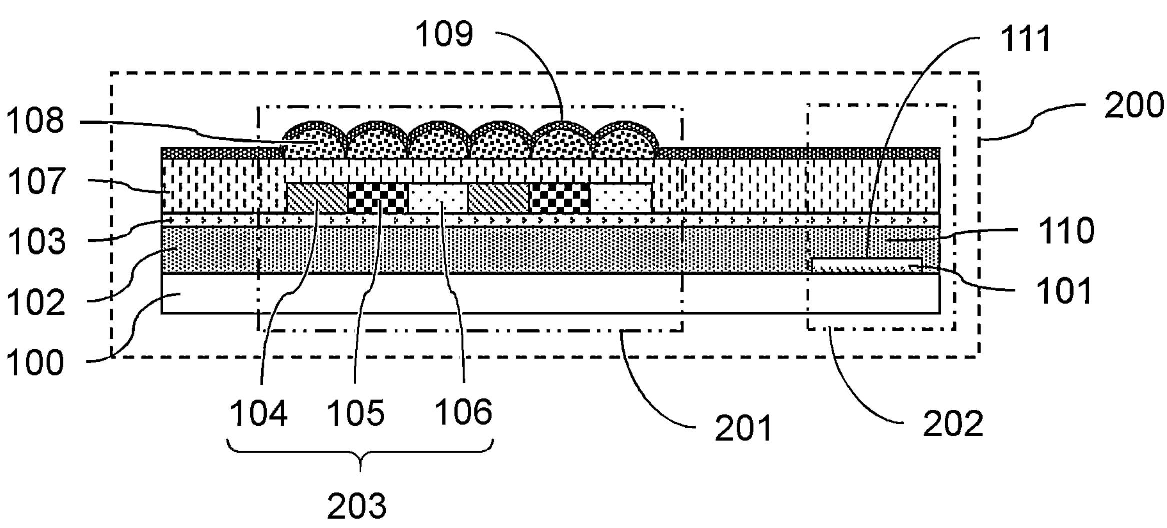
FIG. 2A is a cross-sectional schematic diagram for explaining a method for producing a semiconductor device.

A method for producing the semiconductor device 200 will be explained next with reference to FIG. 2A to FIG. 2D. Herein FIG. 2A is a cross-sectional diagram of the semiconductor device 200 prior to the formation of the openings 110 over bonding pads 101. The bonding pads 101 and the passivation film 102 are formed on the element substrate 100. The lower planarization film 103 is formed for instance by spin coating.

In a case where photosensitive materials are used, the color filter 203, such as the green filter 104, the red filter 105 and the blue filter 106, can be formed for instance by photolithography. The color filter 203 can also be formed by patterning a resist material by photolithography over a filter material having been applied by spin coating, followed by etching using the resist material as a mask, for each color. The upper planarization film 107 is formed for instance by spin coating.

The microlenses 108 can be formed as a result of exposure and development processes. Specifically, a film (photoresist film) made up of the material of the microlenses 108 is formed, the photoresist film being then exposed and developed using a mask exhibiting a continuous gradation change. The microlenses 108 can be formed for instance through photolithography utilizing a surface-area gradation mask that allows for projection of light, exhibiting a continuous gradation change, onto an image formation plane, through modification of the density distribution of dots made up of a light-shielding film of resolution equal to or lower than that of the exposure device.

The shape of the microlenses 108, having been formed as a result of exposure and development processes, can be adjusted through etch-back of the microlenses 108. Alternatively, the material of the microlenses 108 may be applied, exposed and developed, followed by a reflow process, to thereby form the material into microlens shapes. The anti-reflection film 109 is formed using for instance a plasma chemical vapor deposition (plasma CVD) apparatus.

Figure 2B:
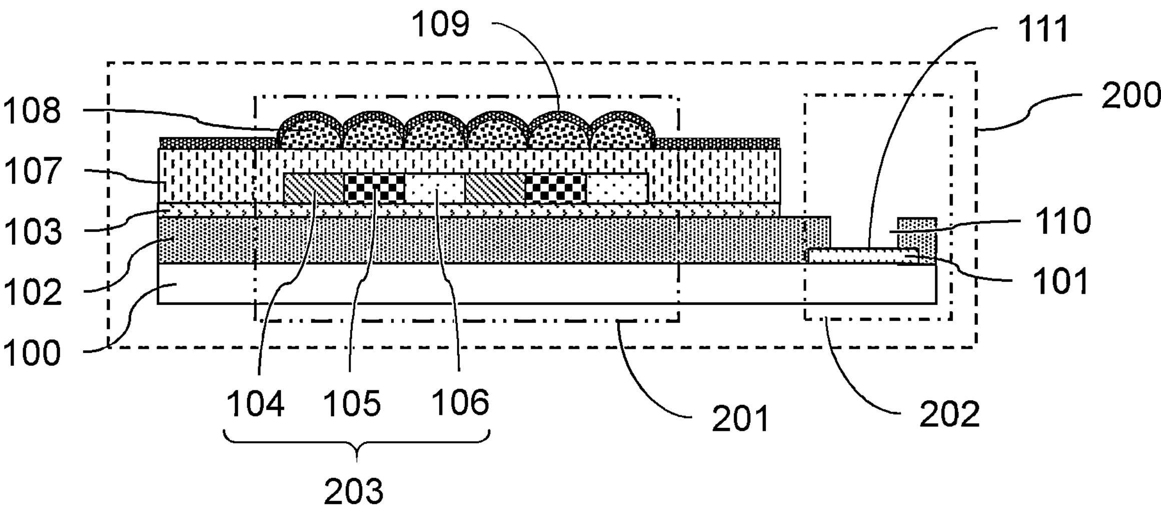
FIG. 2B is a cross-sectional schematic diagram for explaining a method for producing a semiconductor device.

FIG. 2B is a cross-sectional diagram of the semiconductor device 200 in which the openings 110 are formed over the bonding pads 101. The openings 110 are formed for instance by patterning a resist material by photolithography, and removing then the anti-reflection film 109, the upper planarization film 107, the lower planarization film 103 and the passivation film 102 on the bonding pads 101, by dry etching.

Dry etching is accomplished in a plasma etching apparatus using an etching gas that contains fluorine. FIG. 2B illustrates an example in which removal of the anti-reflection film 109, the upper planarization film 107 and the lower planarization film 103, and removal of the passivation film 102, are performed separately through photolithography and dry etching, repeated twice, of a resist material. The number of photolithography and dry etching operations for forming the openings 110 is not limited to two, and may be one or three or more.

A reduction in the number of photolithography and dry etching operations translates into lower cost, on account of the smaller number of steps. When the number of operations is reduced, however, the thickness to be etched at a time increases, and also the photoresist (resist material) may undergo etching. It is therefore preferable to increase the thickness of the photoresist, or to increase dry etching selectivity (selectivity of the layer to be etched, relative to the photoresist and the bonding pads 101).

In a case where the number of operations of photolithography and dry etching is increased, the amount of etching per operation becomes smaller, which translates into a lower risk of photoresist etching. Therefore, the photoresist can be made thinner, and the degree of freedom of conditions, such as dry etching selectivity, is accordingly higher.

Figure 2C:
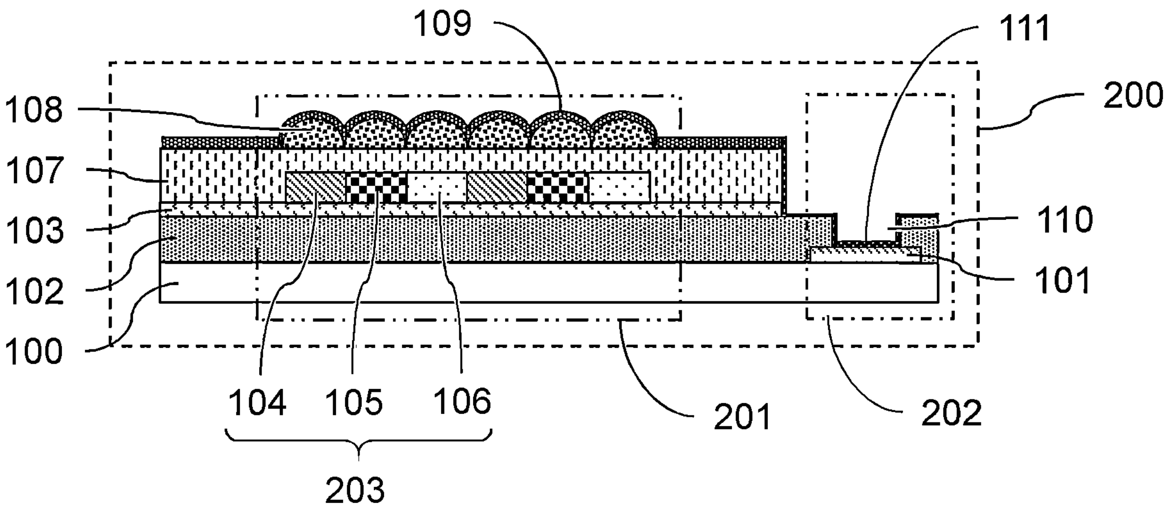
FIG. 2C is a cross-sectional schematic diagram for explaining a method for producing a semiconductor device.

FIG. 2C is a cross-sectional diagram of the semiconductor device 200 in which the protective film 111 is formed. For instance the entire surface of the semiconductor device 200 is sputtered, particles of a film forming material that make up the anti-reflection film 109 are ejected, and the ejected particles are caused to redeposit on the bonding pads 101, while thickness is eroded; the protective film 111 can be formed as a result. That is, particles (target atoms/molecules) of the film forming material such as silicon oxide are ejected from the surface of the anti-reflection film 109, through sputtering, and the ejected particles deposit on the bonding pads 101, whereby the protective film 111 becomes formed. The protective film 111 is formed so as to be connected to the anti-reflection film 109. The number of steps for producing the semiconductor device 200 in which the anti-reflection film 109 and the protective film 111 have dissimilar thicknesses can be reduced by resorting to the above method.

The thickness of the anti-reflection film 109 decreases slightly as a result of sputtering of the anti-reflection film 109; in consequence, the anti-reflection film 109 is preferably formed to a thickness resulting from adding the relevant thickness decrement to the desired thickness. Sputtering can be performed using for instance a plasma etching apparatus. The gas used for sputtering is for instance argon (Ar). By adding a gas containing hydrogen (H) to the gas used for sputtering it becomes possible to reduce, and remove, the fluorine component remaining on the bonding pads 101.

Figure 2D:
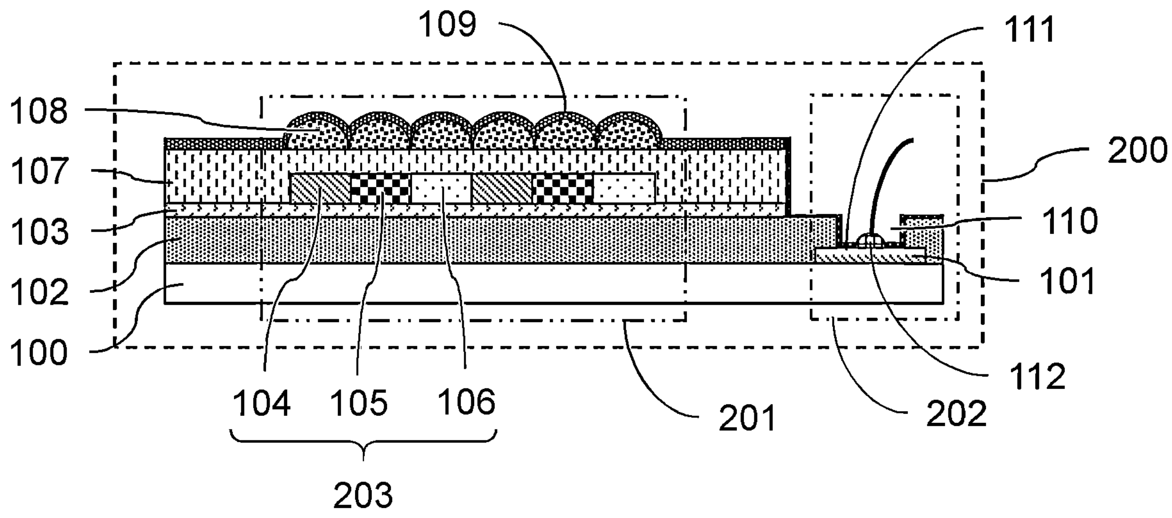
FIG. 2D is a cross-sectional schematic diagram for explaining a method for producing a semiconductor device.

FIG. 2D is a cross-sectional diagram of the semiconductor device 200 after wire bonding. Wire bonding is performed in a state where the protective film 111 has been formed on the bonding pads 101. The bonding pads 101 are electrically connected to bonding balls 112 as a result of breaking through the protective film 111 by wire bonding. When the film thickness of the protective film 111 exceeds the thickness that can be broken through by wire bonding, setting of wire bonding conditions is constrained; accordingly, the thickness of the protective film 111 is preferably 20 nm or smaller.

A specific configuration example of the plurality of organic light-emitting elements disposed in the pixel region 201 of the semiconductor device 200 will be explained next. The anti-reflection film 109 is formed on the upper surface of the microlenses of the organic light-emitting elements. The bonding pads 101 are formed in the external connection terminal region 202 of the semiconductor device 200 having disposed therein a plurality of organic light-emitting elements, the bonding pads 101 being covered with the protective film 111 that is formed by sputtering of the antireflection film 109.

(Structure of the Organic Light-Emitting Elements) Each organic light-emitting element has an insulating layer, an anode, an organic compound layer and a cathode, formed on a substrate. For instance a protective layer, a color filter and microlenses may be provided over the cathode. In a case where a color filter is provided, a planarization layer may be provided between the protective layer and the color filter. A planarization layer may also be provided between the color filter and the microlenses. Examples of materials of the planarization layer include acrylic resins.

(Substrate) Examples of substrate materials include for instance quartz, glass, silicon wafers, resins and metals. Switching elements such as transistors and wiring may be provided on the substrate, and an insulating layer may be provided over the foregoing. A contact hole may be formed in the insulating layer in order to ensure conduction between the anode and the wiring; the concrete material of the insulating layer is incidental herein so long as the material allows securing insulation from the wiring that is not connected. For instance a resin such as a polyimide, or silicon oxide or silicon nitride, can be used as the material of the insulating layer.

(Electrodes) A pair of electrodes can be used as electrodes. The pair of electrodes may be an anode and a cathode. In a case where an electric field is applied so that the organic light-emitting element emits light, the electrode at the higher potential is the anode, and the other electrode is the cathode. Otherwise stated, the electrode that supplies holes to the light-emitting layer is the anode, and the electrode that supplies electrons is the cathode.

The constituent material of the anode preferably has a larger work function than the constituent material of the cathode. For instance simple metals such as gold, platinum, silver, copper, nickel, palladium, cobalt, selenium, vanadium or tungsten, or mixtures containing the foregoing, or alloys being combinations of the foregoing, can be used as the constituent material of the anode. Metal oxides such as tin oxide, zinc oxide, indium oxide, indium tin oxide (ITO) or indium zinc oxide may also be used as the constituent material of the anode. A conductive polymer such a polyaniline, polypyrrole or polythiophene can be used as the constituent material of the anode. These electrode substances may be used singly; alternatively, two or more types of the foregoing may be used concomitantly. The anode may be made up of a single layer, or may be made up of a plurality of layers.

In a case where the electrode is used as a reflective electrode, for instance chromium, aluminum, silver, titanium, tungsten, molybdenum, alloys thereof, or layered bodies of the foregoing, can be used as the constituent material of the electrode. By using these materials, the electrode can also function as a reflective film without acting as an electrode.

Although not limited thereto, for instance a transparent conductive layer of an oxide such as indium tin oxide (ITO) or indium zinc oxide can be used, as a constituent material of the electrode, in a case where the electrode is used as a transparent electrode. A photolithographic technique can be relied upon to form the electrodes.

Preferably, the constituent material of the cathode is a material having a work function smaller than that of the constituent material of the anode. For instance an alkali metal such as lithium, an alkaline earth metal such as calcium, a single metal such as aluminum, titanium, manganese, silver, lead or chromium, or mixtures of the foregoing, can be used as the constituent material of the cathode. Alloys obtained by combining the above single metals, for instance magnesium-silver, aluminum-lithium, aluminum-magnesium, silver-copper and zinc-silver alloys, can also be used as constituent materials of the cathode. Metal oxides such as indium tin oxide (ITO) can also be used as the constituent material of the cathode.

These electrode substances may be used singly; alternatively, two or more types of the foregoing may be used concomitantly. Also, the cathode may be of a single-layer structure or a multilayer structure. Silver is preferably used in the cathode; more preferably, a silver alloy is used, for the purpose of reducing silver aggregation. The alloy ratio is incidental herein so long as silver aggregation can be reduced. For instance the alloy ratio of silver relative to another metal may be 1:1 or 3:1.

The cathode is not particularly limited, and may be in the form of a top emission element that utilizes an oxide conductive layer such as ITO, or may be in the form of a bottom emission element that utilizes a reflective electrode such as aluminum (Al). The method for forming the cathode is not particularly limited, but for instance a DC or AC sputtering method may be resorted to, for improving film coverage and readily lowering resistance.

(Pixel Separation Layer) A pixel separation layer is formed for instance of a silicon nitride (SiN) film, a silicon oxynitride (SiON) film or a silicon oxide (SiO) film in turn formed relying on a chemical vapor deposition method (CVD method). In terms of thickness, the organic compound layer, in particular a hole transport layer, is preferably formed to be thinner on the side wall of the pixel separation layer, in order to increase the in-plane resistance of the organic compound layer. Specifically, the pixel separation layer can be formed to be thinner, at the side wall, by increasing the taper angle of the side wall of the pixel separation layer and the film thickness of the pixel separation layer, and thereby increase vignetting at the time of vapor deposition.

Preferably, the side wall taper angle of the pixel separation layer and the film thickness of the pixel separation layer are adjusted so that no voids are formed in the protective layer formed over the pixel separation layer. Voids are not formed in the protective layer, and accordingly the occurrence of defects in the protective layer can be reduced. Given that the occurrence of defects in the protective layer is reduced, it becomes thus possible to curtail impairment of reliability for instance in terms of occurrence of dark spots and the occurrence defective conduction in the second electrode.

Charge leakage to adjacent pixels can be effectively suppressed even if the side wall of the pixel separation layer does not have a steep taper angle. Leakage of charge to adjacent pixels can be sufficiently reduced if the taper angle is in the range at least 60 degrees and not more than 90 degrees. The thickness of the pixel separation layer is preferably at least 10 nm and not more than 150 nm. A similar effect can be elicited even if the configuration includes only the pixel electrode, without the pixel separation layer. In this case, however, the film thickness of the pixel electrode is preferably half or less that of the organic compound layer, or the ends of the pixel electrode are forward-tapered at less than 60°, since that way short circuits of the organic light-emitting element can be reduced.

(Organic Compound Layer) The organic compound layer may be formed of out of a single layer or out of multiple layers. In a case where the organic compound layer is made up of a plurality of layers, each organic compound layer may be referred to, depending on its function, as a hole injection layer, a hole transport layer, an electron blocking layer, a light-emitting layer, a hole blocking layer, an electron transport layer, or an electron injection layer. The organic compound layer is mainly made up of an organic compound, but may contain inorganic atoms and inorganic compounds. For instance, the organic compound layer may contain copper, lithium, magnesium, aluminum, iridium, platinum, molybdenum or zinc. The organic compound layer may be disposed between the anode and the cathode, and may be disposed in contact with the anode and the cathode.

(Protective Layer) A protective layer may be provided over the cathode. For instance, intrusion of water or the like into the organic compound layer can be suppressed, and the occurrence of display defects can be reduced, through bonding of glass provided with a moisture absorbent onto the cathode. Intrusion of water or the like into the organic compound layer can be prevented by providing a passivation film of for instance silicon nitride on the cathode. For instance the cathode may be transported, once formed, to another chamber, without breaking vacuum, where a silicon nitride film having a thickness of 2 μm may be then formed by CVD, to yield a protective layer. The protective layer may be provided relying on an atomic deposition method (ALD method) after film formation by CVD. The material of the film obtained by ALD is not limited, but may be for instance silicon nitride, silicon oxide or aluminum oxide. Silicon nitride may be further formed by CVD on the film formed by ALD. A film formed by ALD may be thinner than a film formed by CVD. Specifically, the thickness of the former may be 50% or less, or 10% or less.

(Color Filter) A color filter may be provided on the protective layer. For instance, another substrate provided with a color filter that factors in the size of each organic light-emitting element may be affixed to the substrate that has the organic light-emitting element; alternatively, the color filter may be patterned, by photolithography, on the protective layer. The color filter may be made up of a polymer.

(Planarization Layer) The planarization layer may be formed between the color filter and the protective layer. The planarization layer is provided in order to reduce unevenness of the underlying layer. The planarization layer may also be referred to, without limiting the purpose thereof, as a material resin layer. The planarization layer may be made up of an organic compound; the organic compound that is used may be a low-molecular compound or a polymer, but is preferably a polymer.

The planarization layer may be provided above and below the color filter, and the materials of the foregoing may be identical or dissimilar. Examples of materials of the planarization layer include polyvinylcarbazole resins, polycarbonate resins, polyester resins, ABS resins, acrylic resins, polyimide resins, phenol resins, epoxy resins, silicone resins and urea resins.

(Microlens) An organic light-emitting element as one implementation of the semiconductor device 200 may have an optical member such as a microlens on the light exit side thereof. The microlens may be made up of an acrylic resin or epoxy resin. The purpose of the microlens may be to increase the amount of light extracted from the organic light-emitting element, and to control the direction of the extracted light. The microlens may have a hemispherical shape. In a case where the microlens has a hemispherical shape, then one of the tangents that are in contact with the hemisphere is parallel to the insulating layer, the point of contact between that tangent and the hemisphere being the apex of the microlens. The apex of the microlens can be similarly determined in any cross-sectional view. That is, among the tangents that are in contact with the semicircle of the microlens in a cross section, a tangent exists that is parallel to the insulating layer and such that the point of contact between the tangent and the semicircle is the apex of the microlens.

It is also possible to define a midpoint of the microlens. The midpoint of a virtual line segment from an end point of an arc shape to the other end point of the arc shape in a cross section of the microlens can be referred to as the midpoint of the microlens. The cross section for discriminating between the apex and the midpoint may be a cross section perpendicular to the insulating layer.

The microlens has a first surface with a protruded portion and a second surface on the reverse side from that of the first surface. Preferably, the second surface is disposed closer to a functional layer than the first surface. To achieve such a configuration the microlens needs to be formed on the organic light-emitting element. In a case where the functional layer is an organic compound layer, it is preferable to avoid processes that involve a high temperature during the production process. In a case where a configuration is adopted in which the second surface is disposed closer to the functional layer than the first surface, the glass transition temperatures of all the organic compounds that make up the organic compound layer are preferably 100° C. or higher, and more preferably 130° C. or higher.

(Counter Substrate) A counter substrate may be provided over the planarization layer. The counter substrate is thus called so since it is provided at a position facing the above-described substrate. The material of the counter substrate may be the same as the material of the substrate.

(Organic Compound Layers) Organic compound layers (hole injection layer, hole transport layer, electron blocking layer, light-emitting layer, hole blocking layer, electron transport layer, electron injection layer and so forth) that make up the organic light-emitting element are formed in accordance with the following methods.

Each organic compound layer that makes up the organic light-emitting element can be formed in accordance with a dry process such as a vacuum deposition method, an ionization deposition method, sputtering or plasma. The organic compound layer can be formed, instead of a dry process, in accordance with a wet process in which a material is dissolved in an appropriate solvent, whereupon a layer is formed in accordance with a known coating method (for instance spin coating, dipping, casting, an LB method or an inkjet method).

When the organic compound layer is formed by vacuum deposition or solution coating, the organic compound layer does not readily undergo crystallization, and exhibit excellent temporal stability. In a case where the organic compound layer is formed by solution coating, the organic compound layer may be combined with an appropriate binder resin, to form a film.

Examples of the binder resin include, though not limited thereto, for instance polyvinylcarbazole resins, polycarbonate resins, polyester resins, ABS resins, acrylic resins, polyimide resins, phenolic resins, epoxy resins, silicone resins and urea resins.

The binder resin may be a resin that utilizes a single type of homopolymer or copolymer, or may be a resin that utilizes a mixture of two or more types of homopolymer or copolymer. Additives such as known plasticizers, antioxidants and ultraviolet absorbers may be used concomitantly with the binder resin.

(Pixel Circuit) The organic light-emitting element may have a pixel circuit connected to the organic light-emitting element. The pixel circuit may be of active matrix type, with independent control of the emission of first light-emitting elements and of second light-emitting elements. Active matrix circuits may be voltage-programmed or current-programmed. A pixel circuit may be provided for each organic light-emitting element. The pixel circuit includes the organic light-emitting element, a transistor that controls the emission brightness of the organic light-emitting element, a transistor that controls emission timing, a capacitor that holds the gate voltage of the transistor that controls emission brightness, and a transistor for connection to GND bypassing the organic light-emitting element.

The organic light-emitting element has a display area and a peripheral area disposed around the display area. The display area has a pixel circuit, and the peripheral area has a display control circuit. The mobility of the transistors that make up the pixel circuit may be lower than the mobility of the transistors that make up the display control circuit.

The slope of the current-voltage characteristics of the transistors that make up the pixel circuit may be lower than the slope of the current-voltage characteristics of the transistors that make up the display control circuit. The slope of the current-voltage characteristics can be measured on the basis of a so-called Vg-Ig characteristic. The transistors that make up the pixel circuit are connected to the light-emitting element such as a first light-emitting element.

(Pixels) The organic light-emitting elements have a plurality of pixels. Each pixel has sub-pixels that emit different mutually different colors. The sub-pixels may respectively have for instance RGB emission colors.

Each pixel emits light from a region thereof also referred to as pixel aperture. The pixel aperture may be 15 μm or smaller, and may be 5 μm or larger. More specifically, the pixel aperture may be for instance 11 μm, 9.5 μm, 7.4 μm or 6.4 μm. The distance between sub-pixels may be 10 μm or smaller, and specifically may be 8 μm, 7.4 μm or 6.4 μm.

The pixels can adopt any known arrangement layout in a plan view. For instance the pixel array may be a stripe array, a delta array, a pentile array or a Bayer array. The shape of the sub-pixels in a plan view may be any known shape, for instance a rectangular, square, rhomboidal or hexagonal shape. The shape of the sub-pixels in a plan view need not be an exact figure, and for instance a shape that approximates a rectangle falls under a rectangular shape. Sub-pixel shapes and pixel arrangements can be used in combination.

(Use of the Organic Light-Emitting Element) The organic light-emitting element according to the present embodiment can be used as a constituent member of a display device or of a lighting device. Moreover, the organic light-emitting element can be used in an exposure light source for electrophotographic image forming apparatuses, in backlights for liquid crystal display devices, and in light-emitting devices having a color filter in a white light source.

The display device may be an image information processing device having an image input unit for input of image information from an area CCD, a linear CCD, a memory card or the like, and an information processing unit for processing the inputted image information, such that the inputted image information is displayed on a display unit.

The display device may be used in a display unit of an imaging device or an inkjet printer, and may have a touch panel function. The driving scheme of the touch panel function may be an infrared, capacitive, resistive film or electromagnetic induction scheme, and is not particularly limited. The display device may also be used as a display unit in a multi-function printer.

In Embodiment 1 above, the anti-reflection film 109 is formed on the upper surface of the microlenses 108 of the semiconductor device 200. The bonding pads 101 are formed in the external connection terminal region 202 of the semiconductor device 200, the bonding pads 101 being covered with the protective film 111 that is formed by sputtering of the anti-reflection film 109. The thickness of the anti-reflection film 109 is determined on the basis of the wavelength of the light the reflection whereof is to be reduced, and the refractive index of the anti-reflection film 109. The protective film 111 is formed to a thickness such that the protective film 111 can be broken through upon connection of wires to the bonding pads 101. By virtue of the fact that the thicknesses of the anti-reflection film 109 and the protective film 111 are thus dissimilar, the semiconductor device 200 can combine protection of the bonding pads and the optical characteristics (anti-reflection characteristics) of the anti-reflection film on the microlenses.

Embodiment 2

In Embodiment 2 examples will be explained in which the semiconductor device 200 according to Embodiment 1 is applied to various devices.

Figure 3:
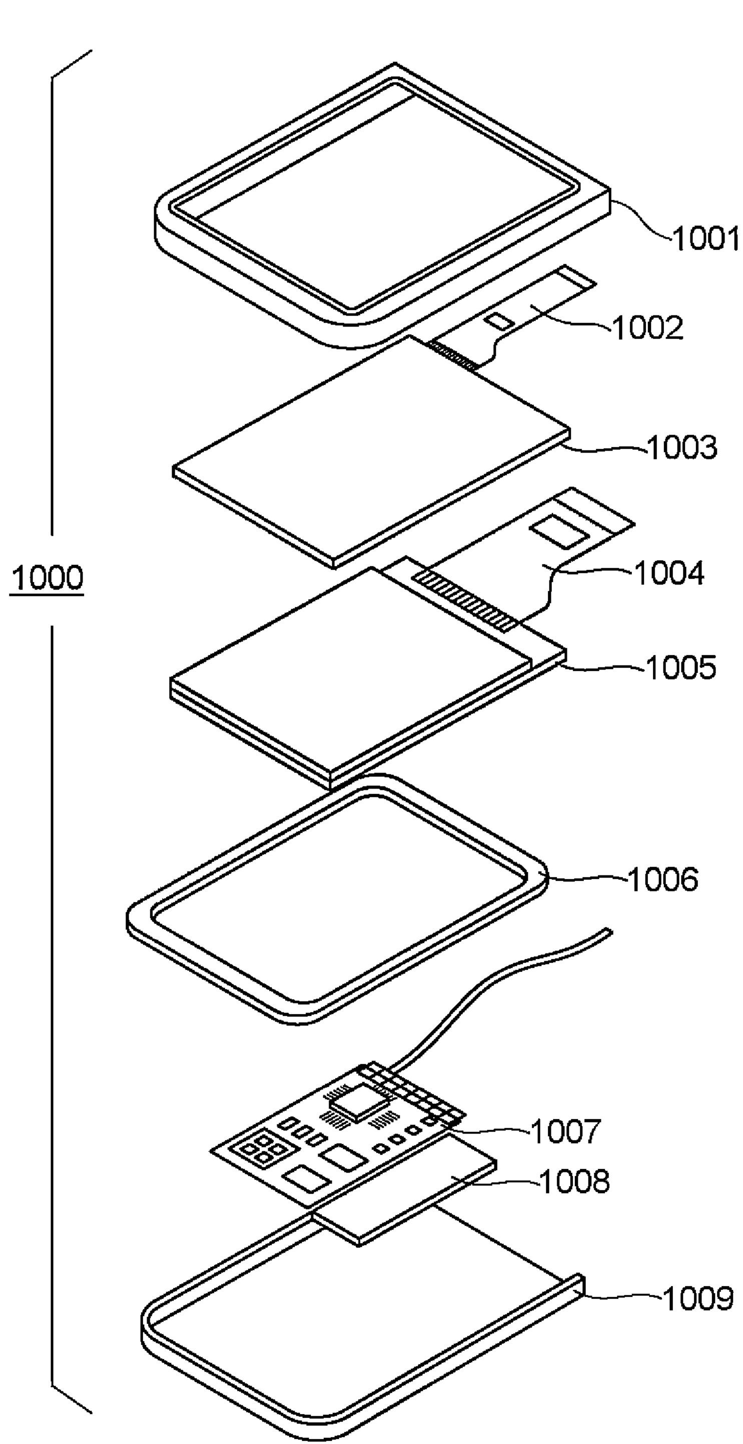
FIG. 3 is a schematic diagram illustrating a display device according to Embodiment 2.

FIG. 3 is a schematic diagram illustrating a display device 1000 being an example of the display device according to the present embodiment. The display device 1000 may have a touch panel 1003, a display panel 1005, a frame 1006, a circuit board 1007 and a battery 1008, between an upper cover 1001 and a lower cover 1009.

The display panel 1005 is a display unit having the semiconductor device 200 according to Embodiment 1, and which performs display using light emitted from the semiconductor device 200. Flexible printed circuits FPC 1002, 1004 are connected to the touch panel 1003 and the display panel 1005. A control circuit including transistors and that is printed on the circuit board 1007 executes various control tasks, such as control of the display panel 1005. The battery 1008 may be omitted if the display device is not a portable device, or even if the display device is a portable device, the battery 1008 may be provided at a different position. The display device 1000 may have three types of color filters, respectively corresponding to red, green and blue. A plurality of color filters may be disposed in a delta arrangement.

The display device 1000 may be used as a display unit of a mobile terminal. In that case the display device 1000 may have both a display function and an operation function. Mobile terminals include mobile phones such as smartphones, tablets and head-mounted displays.

The display device 1000 may be used in a display unit of an imaging device that has an optical unit having a plurality of lenses, and that has an imaging element that receives light having passed through the optical unit. The imaging device may have a display unit that displays information acquired by the imaging element (for instance an image captured by the imaging element). The display unit may be a display unit exposed to the exterior of the imaging device, or may be a display unit disposed within a viewfinder. The imaging device may be for instance a digital camera or a digital video camera.

Figure 4A:
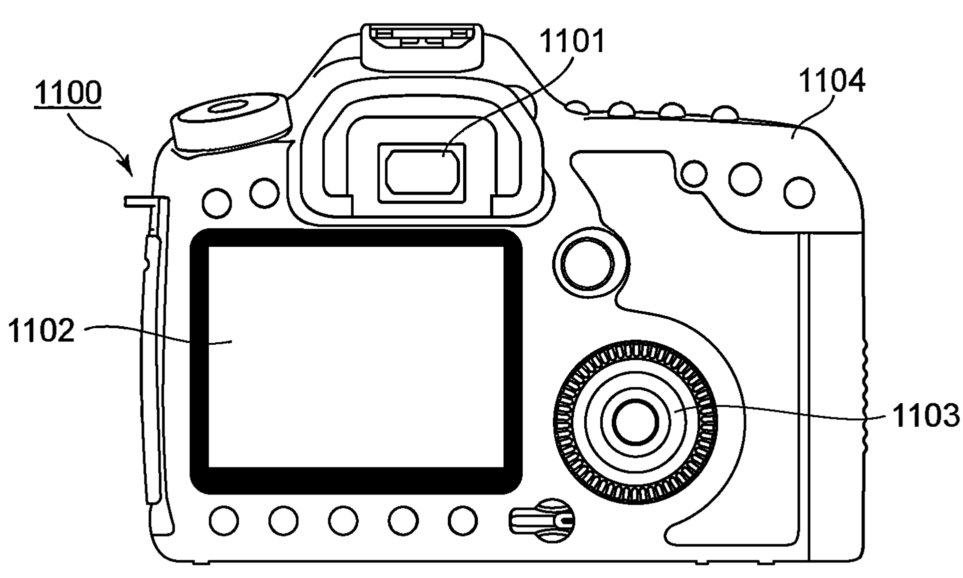
FIG. 4A and FIG. 4B are schematic diagrams illustrating an imaging device and an electronic device according to Embodiment 2.

FIG. 4A is a schematic diagram illustrating an imaging device 1100, being an example of the imaging device according to the present embodiment. The imaging device

1100 may have a viewfinder 1101, a rear display 1102, an operation unit 1103 and a housing 1104. The viewfinder 1101 may have the display device according to the present embodiment (display device having the semiconductor device 200 according to Embodiment 1 and which performs display using light emitted from the semiconductor device 200). In that case the display device may display not only an image to be captured, but also for instance environment information and imaging instructions. The environment information may include for instance external light intensity, external light orientation, moving speed of a subject, and the chance of the subject being blocked by an obstacle. The rear display 1102 may also have a display device according to the present embodiment.

The timing suitable for imaging is short, and hence information should be displayed as soon as possible. Therefore, a display device is preferably used that utilizes organic light-emitting elements having high response speed. A display device that utilizes organic light-emitting elements can be utilized more suitably than for instance a liquid crystal display device, in a device from which a high display speed is required.

The imaging device 1100 has an optical unit (not shown). The optical unit has a plurality of lenses, and forms an image of light on an imaging element accommodated in the housing 1104. The lenses can be focused through adjustment of the relative positions thereof. This operation can also be performed automatically. The imaging device 1100 may be referred to as a photoelectric conversion device. The photoelectric conversion device can encompass, as an imaging method other than sequential imaging, a method that involves detecting a difference relative to a previous image or a method that involves cutting out part of a recorded image.

Figure 4B:
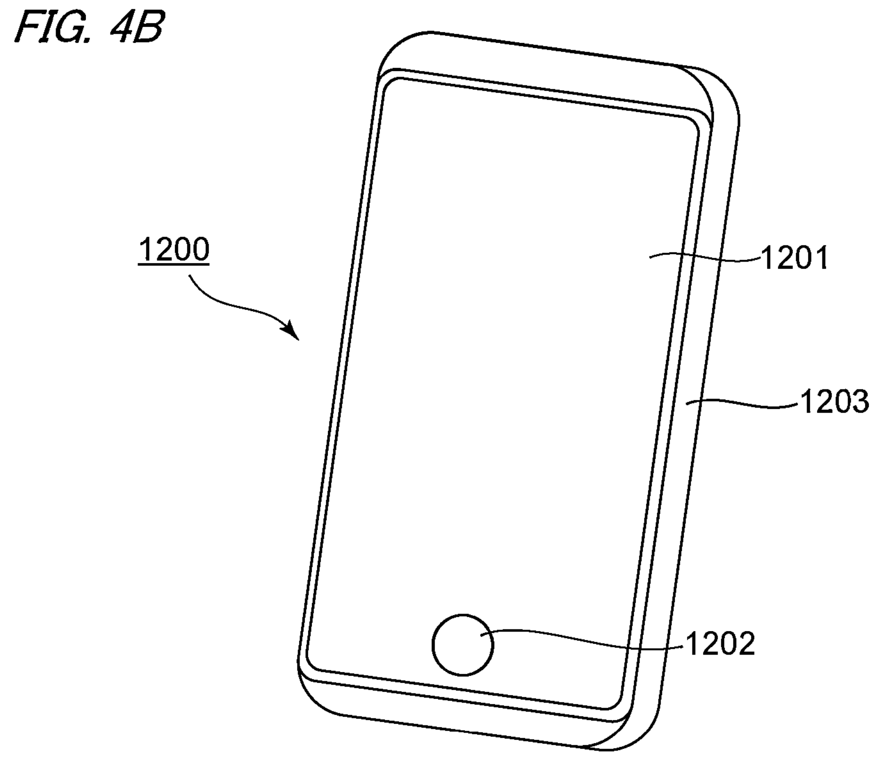

FIG. 4B is a schematic diagram illustrating an electronic device 1200 being an example of the electronic device according to the present embodiment. The electronic device 1200 has a display unit 1201, an operation unit 1202 and a housing 1203. The display unit 1201 includes the semiconductor device 200 according to Embodiment 1, and performs display using light emitted from the semiconductor device 200. The electronic device 1200 may include, in the housing 1203, a circuit, a printed board having the circuit, a battery and a communication unit for communication with the exterior. The operation unit 1202 may be a button, or a touch panel-type reaction unit. The operation unit may be a biometric recognition unit which for instance performs unlocking upon recognition of a fingerprint. The electronic device having a communication unit can also be referred to as a communication device. The electronic device may further have a camera function, by being provided with a lens and an imaging element. Images captured by way of the camera function are displayed on the display unit. Examples of electronic devices include smartphones and notebook computers.

Figure 5A:
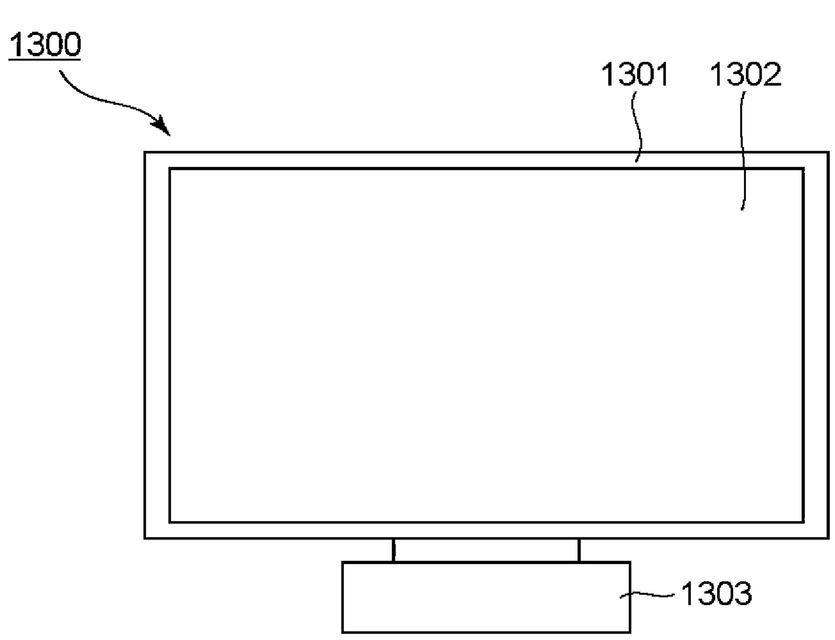
FIG. 5A and FIG. 5B are schematic diagrams illustrating a display device according to Embodiment 2.
Figure 5B:
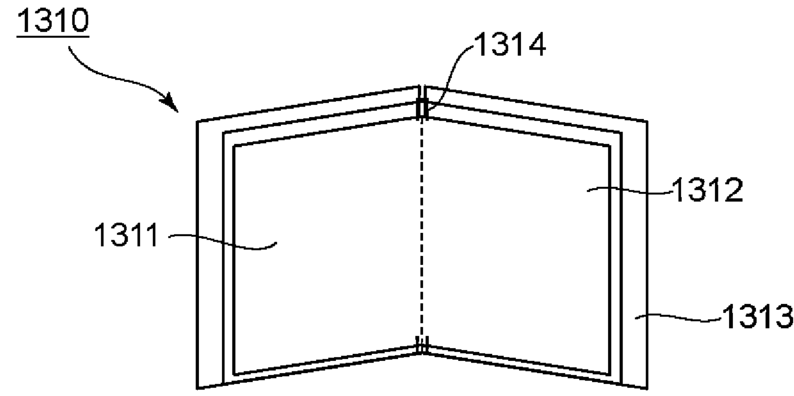

FIG. 5A and FIG. 5B are schematic diagrams illustrating a display device 1300, which is an example of the display device according to the present embodiment. The display device 1300 is a display device such as a television monitor or a PC monitor. The display device 1300 has a frame 1301, a display unit 1302, and a base 1303 that supports the frame 1301 and the display unit 1302. The display unit 1302 has the semiconductor device 200 according to Embodiment 1, and performs display using light emitted from the semiconductor device 200. The form of the base 1303 is not limited to the form of FIG. 5A. The lower side of the frame 1301 may also double as the base 1303. The frame 1301 and the display unit 1302 may be curved. The radius of curvature of the foregoing may be at least 5000 mm and not more than 6000 mm.

FIG. 5B is a schematic diagram illustrating a display device 1310 being an example of another display device according to the present embodiment. The display device 1310 is a so-called foldable display device, configured to be foldable. The display device 1310 has a first display unit 1311, a second display unit 1312, a housing 1313 and a folding point 1314. The first display unit 1311 and the second display unit 1312 each has the semiconductor device 200 according to Embodiment 1, and performs display using light emitted from the semiconductor device 200. The first display unit 1311 and the second display unit 1312 may be one seamless display device. The first display unit 1311 and the second display unit 1312 can be separated at the folding point. The first display unit 1311 and the second display unit 1312 may display different images; alternatively, the first display unit 1311 and the second display unit 1312 may display one image.

Figure 6A:
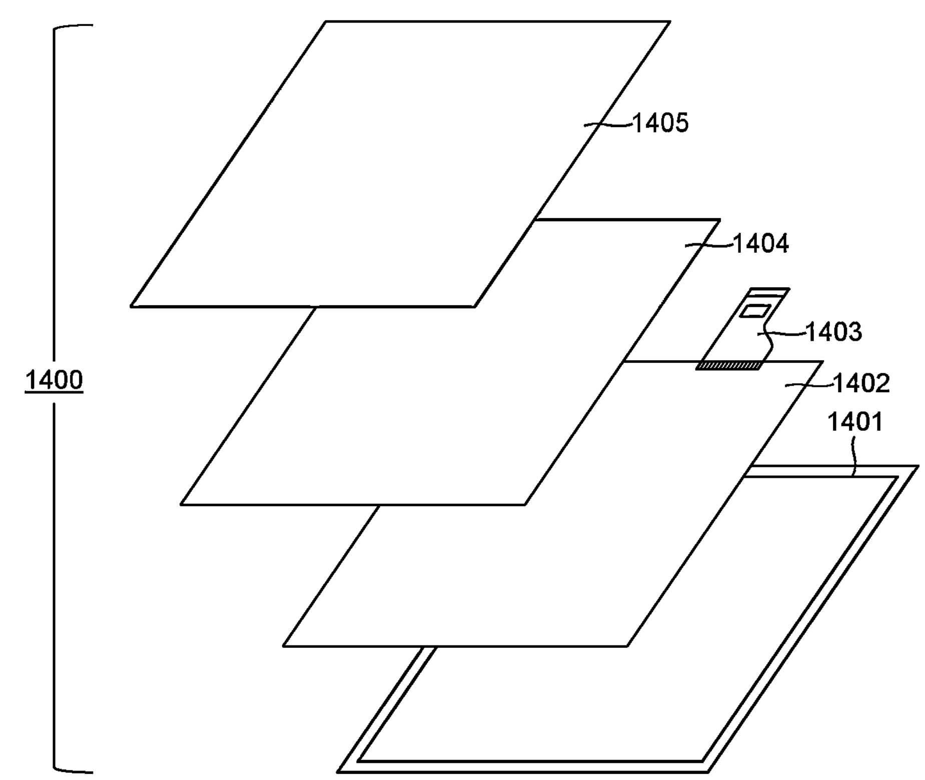
FIG. 6A and FIG. 6B are schematic diagrams illustrating a lighting device and a moving body according to Embodiment 2.

FIG. 6A is a schematic diagram illustrating a lighting device 1400 being an example of a lighting device according to the present embodiment. The lighting device 1400 may have a housing 1401, a light source 1402, a circuit board 1403, an optical film 1404 and a light diffusion part 1405. The light source 1402 has the semiconductor device 200 according to Embodiment 1. The optical film 1404 may be a filter (optical filter) for improving the color rendering properties of the light source 1402. The light diffusion part 1405 allows effectively diffusing light from the light source 1402 and allows delivering light over a wide area, for instance in exterior decorative lighting. The optical film 1404 and the light diffusion part 1405 may be provided on the light exit side of the lighting device 1400. A cover may be provided on the outermost part, as the case may require.

The lighting device 1400 is for instance a device for indoor illumination. The lighting device 1400 may emit white, daylight white, or other colors (any color from blue to red). White is herein a color with a color temperature of 4200 K, and daylight white is a color with a color temperature of 5000 K. The lighting device 1400 may have a light control circuit for controlling the emission color of the lighting device 1400. The lighting device 1400 may have a power supply circuit connected to the light source 1402. The power supply circuit is a circuit that converts AC voltage to DC voltage. The lighting device 1400 may also have a color filter. The lighting device 1400 may have a heat dissipation part. The purpose of the heat dissipation part is to dump, to the exterior, heat from inside the device; the heat dissipation part may be made up of a metal or of liquid silicone rubber exhibiting high specific heat.

Figure 6B:
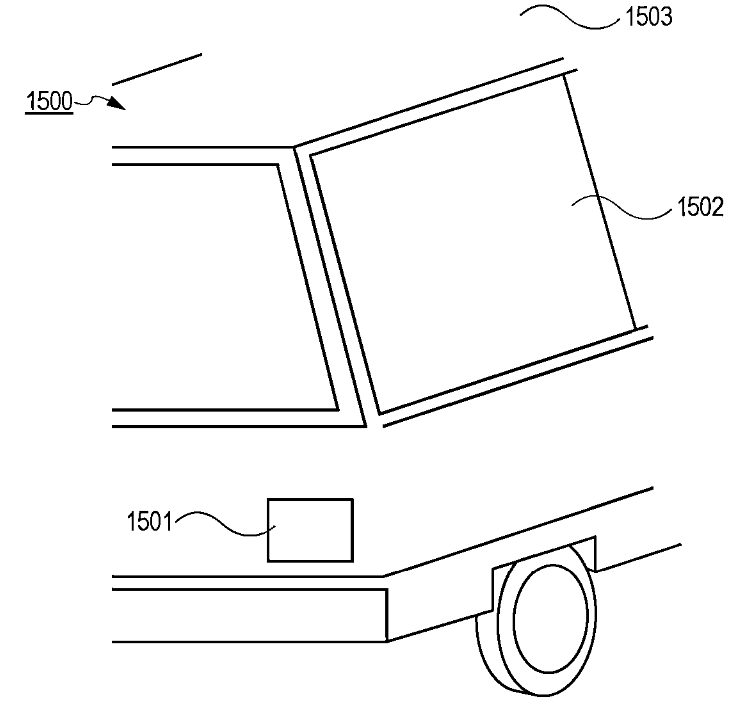

FIG. 6B is a schematic diagram illustrating an automobile 1500, being an example of a moving body according to the present embodiment. The automobile 1500 may have a tail lamp 1501, being an example of a lamp. The tail lamp 1501 lights up for instance in response to a braking operation.

The tail lamp 1501 has the semiconductor device 200 according to Embodiment 1. The tail lamp 1501 may have a protective member that protects the semiconductor device 200. The protective member may be made up of any material, provided that the material has a certain degree of strength and is transparent; the protective member is preferably made up of polycarbonate or the like. For instance a furandicarboxylic acid derivative or an acrylonitrile derivative may be mixed with the polycarbonate.

The automobile 1500 may have a vehicle body 1503 and a window 1502 attached to the vehicle body 1503. The window 1502 may be a transparent display, unless the window 1502 is a window for looking ahead and behind the automobile 1500. The transparent display may have the semiconductor device 200 according to Embodiment 1. In that case, constituent materials such as the electrodes of the semiconductor device 200 are made up of transparent members.

The moving body according to the present embodiment may be a for instance a vessel, an aircraft or a drone. The moving body may have a body frame and a lamp provided on the body frame. The lamp may emit light to indicate the position of the body frame. The lamp has the semiconductor device 200 according to Embodiment 1.

The display device according to the present embodiment (display device having the semiconductor device 200 according to Embodiment 1 and which performs display using light emitted from the semiconductor device 200) can be used for instance in a wearable device such as smart glasses, HMDs or smart contacts. The display device according to the present embodiment can also be applied to a system having for instance a wearable device. An imaging display device used for instance as a wearable device has an imaging device capable of photoelectrically converting visible light, and a display device capable of emitting visible light.

Figure 7A:
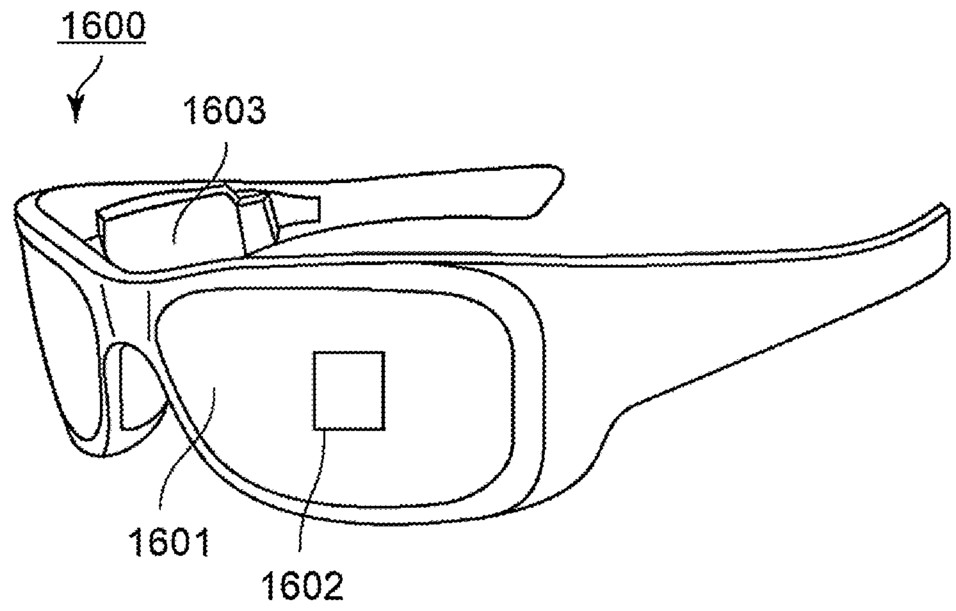
FIG. 7A and FIG. 7B are schematic diagrams illustrating a wearable device according to Embodiment 2.

FIG. 7A is a schematic diagram illustrating spectacles 1600 (smart glasses) being an example of a wearable device according to the present embodiment. An imaging device 1602 such as a CMOS sensor or a SPAD is provided on the front surface side of a lens 1601 of the spectacles 1600. A display device according to the present embodiment (display device having the semiconductor device 200 according to Embodiment 1 and that performs display using light emitted from the semiconductor device 200) is provided on the rear surface side of the lens 1601.

The spectacles 1600 further have a control device 1603. The control device 1603 functions as a power source that supplies power to the imaging device 1602 and the above display device. The control device 1603 controls the operations of the imaging device 1602 and of the display device. The lens 1601 has formed therein an optical system for condensing light onto the imaging device 1602.

Figure 7B:
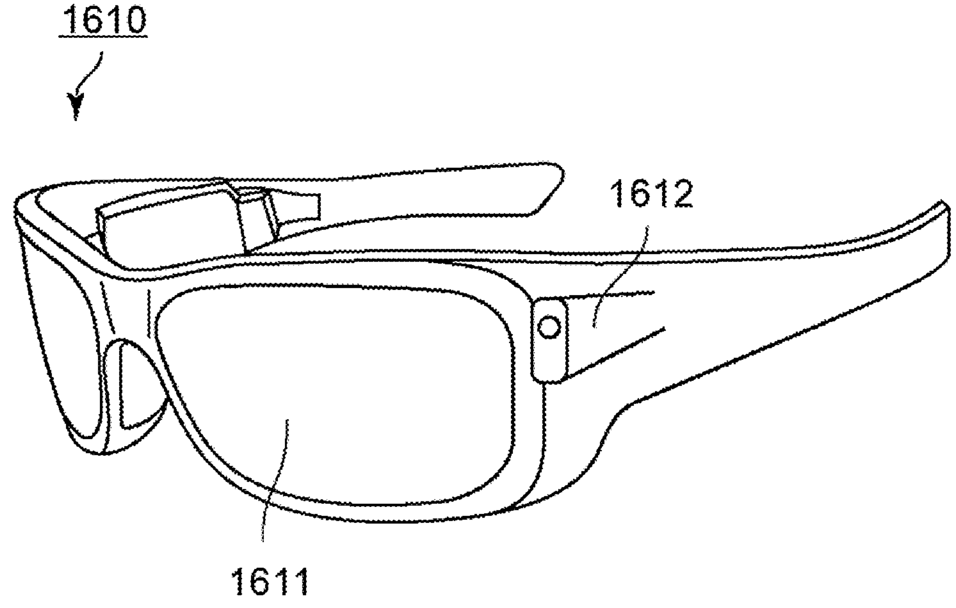

FIG. 7B is a schematic diagram illustrating spectacles 1610 (smart glasses) being an example of the wearable device according to the present embodiment. The spectacles 1610 have a control device 1612, the control device 1612 having mounted thereon an imaging device corresponding to the imaging device 1602, and the display device according to the present embodiment. In a lens 1611 there are formed an imaging device within the control device 1612 and an optical system for projecting the light emitted from the display device, such that an image is projected onto the lens 1611. The control device 1612 functions as a power source that supplies power to the imaging device and the display device, and also controls the operations of the imaging device and of the display device.

The control device may have a line-of-sight detection unit that detects the line of sight of the wearer of the spectacles 1610. Infrared rays may be used herein for line-of-sight detection. An infrared light-emitting unit emits infrared light towards one eyeball of a user who is gazing at a display image. The light emitted is reflected by the eyeball, and is detected by an imaging unit having a light-receiving element, whereby a captured image of the eyeball is obtained as a result. Drops in the quality of the image projected from the display device onto the lens 1611 are reduced by having a reduction unit that reduces light from the infrared light-emitting unit to the display unit in a plan view. The control device detects the line of sight of the user with respect to the display image on the basis of the captured image of the eye obtained through infrared light imaging. Any known method can be resorted to for line-of-sight detection using a captured image of the eyeball. As an example, a line-of-sight detection method can be resorted to that utilizes a Purkinje image obtained by reflection of irradiation light on the cornea. More specifically, line-of-sight detection processing based on a pupillary-corneal reflection method is carried out herein. The line of sight of the user is detected by calculating a line-of-sight vector that denotes the orientation (rotation angle) of the eyeball, on the basis of a Purkinje image and a pupil image included in the captured image of the eyeball, in accordance with a pupillary-corneal reflection method.

In a case where display control is performed on the basis of visual recognition detection (line-of-sight detection), the semiconductor device 200 according to Embodiment 1 can be preferably used in smart glasses having an imaging device that captures images of the exterior. The smart glasses can display captured external information in real time.

The display device according to the present embodiment (display device including the semiconductor device 200 according to Embodiment 1 and which performs display using light emitted from the semiconductor device 200) may include an imaging device having a light-receiving element, such that the displayed image is controlled on the basis of line-of-sight information of the user from the imaging device. Specifically, a first visual field area gazed at by the user and a second visual field area, other than the first visual field area, are determined on the basis of line-of-sight information. The first visual field area and the second visual field area may be determined by the control device of the display device; alternatively, the display device may receive visual field areas determined by an external control device. In the display area of the display device, the display resolution in the first visual field area may be controlled to be higher than the display resolution in the second visual field area. That is, the resolution of the second visual field area may set to be lower than that of the first visual field area.

The display area may have a first display area and a second display area different from the first display area, with the higher priority area from among the first display area and the second display area being determined on the basis of the line-of-sight information. The first display area and the second display area may be determined by the control device of the display device; alternatively, the display device may receive display areas determined by an external control device. The resolution in areas with high priority may be controlled so as to be higher than the resolution of areas other than high-priority areas. That is, the resolution of areas of relatively low priority may be lowered.

Herein AI may be used to determine the first visual field area and high-priority areas. The AI may be a model constructed to estimate a line-of-sight angle, from an eyeball image, and the distance to an object lying ahead in the line of sight, using training data in the form of the image of the eyeball and the direction towards which the eyeball in the image was actually gazing at. Herein an AI program may be provided in the display device, in the imaging device, or in an external device. In a case where the AI program is in the external device, the AI program is transmitted to the display device via communication.

FIG. 8A is a schematic diagram illustrating an image forming apparatus 40, being an example of an image forming apparatus according to the present embodiment. The image forming apparatus 40 has a photosensitive member 27, an exposure light source 28, a charging unit 30, a developing unit 31, a transfer device 32, transport rollers 33 and a fixing unit 35.

Light 29 is emitted from the exposure light source 28, whereupon an electrostatic latent image becomes formed on the surface of the photosensitive member 27. The semiconductor device 200 according to Embodiment 1 can be used in the exposure light source 28. The developing unit 31 has for instance a toner, and causes the toner to adhere to the electrostatic latent image formed on the surface of the photosensitive member 27. The charging unit 30 charges the photosensitive member 27. A transfer device 32 transfers a developed image to a recording medium 34. The transport rollers 33 transport the recording medium 34. The recording medium 34 is for instance paper. A fixing unit 35 fixes the image formed on the recording medium.

FIG. 8B and FIG. 8C are schematic diagrams illustrating an exposure light source 28 in which multiple light-emitting units 36 are disposed on an elongated substrate. The light-emitting units 36 have the organic light-emitting element explained in Embodiment 1. The light-emitting units 36 may have a plurality of organic light-emitting elements. When the semiconductor device 200 according to Embodiment 1 is applied to the exposure light source 28, the light-emitting units 36 are disposed in the pixel region 201. The bonding pads 101 (not shown) formed in the external connection terminal region 202 of the exposure light source 28 are protected by being covered with the protective film 111.

The arrow 37 denotes a direction parallel to the axis of the photosensitive member, and denotes a column direction in which the light-emitting units 36 are disposed. The column direction denoted by the arrow 37 is the same direction as the rotation axis of the photosensitive member 27, and can also be referred to as the long axis direction of the photosensitive member 27.

FIG. 8B illustrates an exposure light source 28 of a form in which the light-emitting units 36 are arrayed in two rows along the long axis direction of the photosensitive member 27. FIG. 8C illustrates a form of the exposure light source 28 different from that of FIG. 8B. In the exposure light source 28 of FIG. 8B, the light-emitting units 36 are lined up in four rows spaced apart from each other. Specifically, the light-emitting units 36 are disposed in the first and third rows, in odd-numbered columns, and are disposed in the second and fourth rows, in even-numbered columns. The arrangement of the light-emitting units 36 in FIG. 8C is a grid arrangement, also called a houndstooth or checkered arrangement.

As explained above, various devices can stably display images with good image quality, over long periods of time, through the use of the semiconductor device 200 according to Embodiment 1.

The functional units (configurations) of the various devices explained in Embodiment 2 may or may not be individual pieces of hardware. Functions of two or more functional units may be realized by shared hardware. Each of multiple functions of one functional unit may be implemented by separate pieces of hardware. Two or more functions of one functional unit may be realized by shared hardware. The functional units may or may not be realized by hardware such as ASICs, FPGAs and DSPs. For instance, the device may have a processor and a memory (storage medium) in which a control program is stored. The functions of at least some of the functional units of the device may be realized in that the processor reads out a control program from the memory, and executes the control program.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The present invention succeeds in providing a semiconductor device having an optical function and in which bonding pads are protected, in consideration of the optical characteristics of an anti-reflection film on a microlens.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-092122, filed on Jun. 7, 2022, which is hereby incorporated by reference herein in its entirety.

What is claimed is:

1. A semiconductor device, comprising:

a substrate having a pixel region in which a functional element is disposed, and a terminal region disposed at a position different from that of the pixel region;

a connection terminal disposed in the terminal region;

an anti-reflection film disposed closer to a light incidence side or light exit side than the functional element; and a protective film disposed, on a surface of the connection terminal, with a thickness of 20 nm or less, wherein the thickness of the protective film is different from a thickness of the anti-reflection film and is such that the protective film is broken through at a time of connection of a wire to the connection terminal, and wherein a material of the protective film and a material of the antireflection film are the same.

2. The semiconductor device of claim 1, further comprising:

a microlens formed in the pixel region, wherein the anti-reflection film is disposed so as to cover the microlens.

3. The semiconductor device of claim 1, wherein the thickness of the protective film is smaller than the thickness of the anti-reflection film.

4. The semiconductor device of claim 1, wherein the thickness of the protective film is 8 nm or more.

5. The semiconductor device of claim 1, wherein the thickness of the anti-reflection film is 30 nm to 500 nm.

6. The semiconductor device of claim 1, wherein the anti-reflection film and the protective film are formed of an inorganic material containing silicon oxide and silicon nitride.

7. The semiconductor device of claim 1, wherein an imaging element is disposed in the pixel region.

8. The semiconductor device of claim 1, wherein a light-emitting element is disposed in the pixel region.

9. The semiconductor device of claim 1, wherein the protective film is formed through sputtering of the anti-reflection film and re-deposition on the terminal region.

10. The semiconductor device of claim 1, wherein the thickness of the anti-reflection film is determined based on a wavelength of light reflection of which is to be reduced, and a refractive index of the anti-reflection film.

11. A light-emitting device, comprising:

a substrate having a pixel region in which a light-emitting element is arranged, and a terminal region disposed at a position different from that of the pixel region;

a connection terminal disposed in the terminal region;

an anti-reflection film disposed closer to a light exit side than the light-emitting element; and a protective film disposed on a surface of the connection terminal, wherein a thickness of the protective film is different from a thickness of the anti-reflection film and is such that the protective film is broken through at a time of connection of a wire to the connection terminal, and wherein a material of the protective film and a material of the antireflection film are the same.

12. The light-emitting device of claim 11, wherein the thickness of the protective film is smaller than the thickness of the anti-reflection film.

13. The light-emitting device of claim 11, further comprising:

a microlens disposed closer to a light exit side than the light-emitting element, in the pixel region, wherein the anti-reflection film is disposed on the light exit side of the microlens.

14. The light-emitting device of claim 11, wherein the anti-reflection film and the protective film are formed contiguously.

15. A display device, comprising:

a display unit having the semiconductor device of claim 1; and a control circuit that controls the display unit.

16. An imaging device, comprising:

an optical unit;

an imaging element that receives light passing through the optical unit; and a display unit that displays an image captured by the imaging element, wherein the display unit has the semiconductor device of claim 1.

17. An electronic device, comprising:

a display unit having the semiconductor device of claim 1;

a housing in which the display unit is provided; and a communication unit, provided in the housing, and that communicates with the exterior.

18. An image forming apparatus, comprising:

a light source having the semiconductor device of claim 1;

a developing unit, irradiated by the light source, and in which toner is caused to adhere to an electrostatic latent image formed on the surface of a photosensitive member; and a transfer device that transfers, to a recording medium, an image developed by the developing unit.

19. A display device, comprising:

a display unit having the light-emitting device of claim 11; and a control circuit that controls the display unit.

* * * * *